April 1, 1952 E. A. JOHNSON 2,590,864

HIGH-FREQUENCY RADIO APPARATUS

Filed Sept. 14, 1945 4 Sheets-Sheet 1

Inventor
EDWIN A. JOHNSON

By Ralph L Chappell

Attorney

April 1, 1952 E. A. JOHNSON 2,590,864

HIGH-FREQUENCY RADIO APPARATUS

Filed Sept. 14, 1945 4 Sheets-Sheet 2

Inventor

EDWIN A. JOHNSON

By Ralph L. Chappell

Attorney

April 1, 1952 E. A. JOHNSON 2,590,864

HIGH-FREQUENCY RADIO APPARATUS

Filed Sept. 14, 1945 4 Sheets-Sheet 3

Inventor

EDWIN A. JOHNSON

By Ralph L. Chappell

Attorney

Inventor
EDWIN A. JOHNSON
By Ralph L. Chappell
Attorney

Patented Apr. 1, 1952

2,590,864

UNITED STATES PATENT OFFICE 2,590,864

HIGH-FREQUENCY RADIO APPARATUS

Edwin A. Johnson, Washington, D. C.

Application September 14, 1945, Serial No. 616,429
3 Claims. (Cl. 179—171)

(Granted under the act of March 3, 1883, as amended April 30, 1928; 370 O. G. 757)

This invention relates to high-frequency coupling devices and, more particularly, to tuned cavity resonator devices and circuits suitable for use at high frequencies and greater in the preamplifying or preselection circuits of superheterodyne receivers intended for the reception of such frequencies.

An object of the present invention is to provide a novel high frequency preamplifying circuit arrangement utilizing tuned inductances of the cavity resonator type which are devoid of any sliding tuning members, in the R-F amplifier, in the mixer or converter, and in the oscillator stages, respectively, of such receiving apparatus.

Another object of the invention is the provision of a high-frequency resonant circuit employing tuned cavity type resonator units each of fixed resonator chamber dimensions which will permit gang-tuning of the resonator units with accurate tracking.

Another object of the invention is to devise unitary resonant chamber assemblies embodying two R-F amplifier stages, an oscillator stage and a converter stage, and each with the necessary tuning capacitors, the entire assembly being designed as a unit which may be easily and quickly inserted as a preamplifier system in a superheterodyne receiver to replace the LC lumped circuit preselection system commonly employed.

A further object of the invention is to provide a system of gang-tuned high-Q, cavity resonator coupling devices and circuits.

A still further object is to provide a ganged tuning system employing a plurality of novel rotary variable tuning capacitors for tuning the cavity resonator circuits.

Other objects, features and advantages of the invention will be apparent from the following particular description of a preferred embodiment thereof taken in connection with the accompanying drawing, in which:

Fig. 1 is a diagrammatic showing of a typical preamplifier or preselector circuit employing gang-tuned cavity resonator devices as the tuned resonant circuits;

Figs. 2 and 3 each are top plan views of a typical preamplifier or preselector circuit assembly utilizing cavity resonators of the type shown in Fig. 1 showing the compact and fully shielded arrangement thereof, the Fig. 3 representation being the same as that of Fig. 2 but with the top cover removed;

This invention makes use of cavity resonator devices as tuned resonant circuits, tuning of the individual resonators being obtained by means of especially designed rotary variable cylindrical capacitors for varying the capacitance in conjunction with a gang-tuning system for effecting tuning of all resonators simultaneously.

Figure 1:
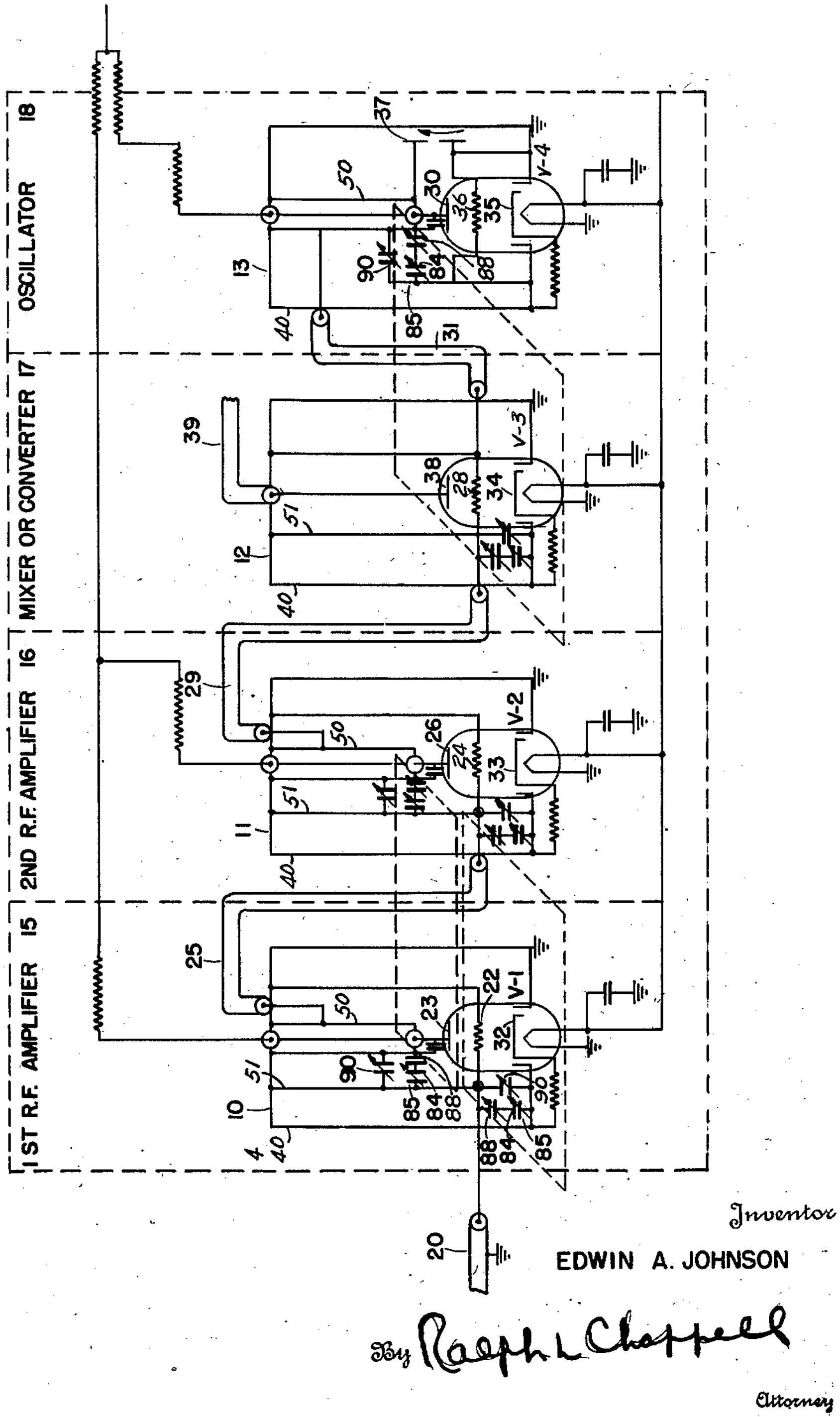
Figure 2:
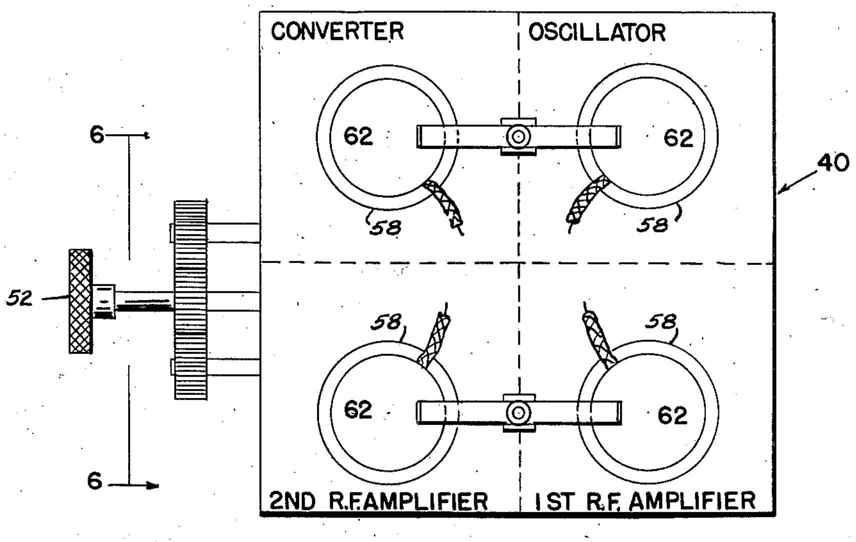

Referring more specifically to Fig. 1, there is shown a preamplifier or preselection circuit for use in a superheterodyne receiver comprising two stages of radio frequency amplification, a mixer or converter stage, and an oscillator stage. The tuning circuits are shown as consisting of cavity resonator devices 10, 11, 12 and 13 which are utililzed as tuned resonant circuits. As more clearly shown in Figs. 3 and 4, each of the cavity resonator devices 10, 11, 12 and 13 comprises an enclosing chamber 40 containing a concentric hollow conductor assembly.

In the arrangement diagrammatically shown in Fig. 1, the received signal is conducted from the antenna along the low impedance coaxial transmission line 20 and applied to low impedance points on the first tuned cavity resonator device 10. This device is coupled to the control grid 22 of a radio-frequency amplifier tube V-1 (type 446) by means of a grid-lead tapped at a point on the device 10 whose impedance corresponds to the input impedance of tube V-1. The incoming received signal is amplified in tube V-1 and the amplified output fed from its anode 23 to the control grid 24 of the second radio frequency amplifier tube V-2 (type 446) via coaxial lead 25 which is tapped at a point on the second tuned cavity resonator device 11 at which the impedance corresponds to the combined impedance presented by the anode or plate 23 of the 1st R-F amplifier and the control grid 24 of the 2nd R-F amplifier 16. The previously amplified signal is further amplified in tube V-2 and the amplified output of this tube is fed from its anode or plate 26 to the control grid 28 of the mixer or converter tube V–3 (type 446) via coaxial lead 29 which is tapped at a point on the third tuned cavity resonator device 12 where the impedance corresponds to the combined impedance presented by the 2nd R-F amplifier anode 26 and the mixer control grid 28. The oscillator tube V–4 also is a type 446 "lighthouse" triode. The mixer stage 17 is coupled from its control grid 28 to the resonator 13 associated with oscillator tube V–4 by means of coaxial conductor 31. The coupling points are so adjusted as to provide proper impedance matching between the resonator device 13 and the tube elements of tube V–4. Cathodes 32, 33, 34 and 35 of tubes V–1, V–2, V–3 and V–6, respectively, each are at ground potential. Oscillator voltage is coupled from plate 30 of tube V–4 of the cavity resonator device 13 via coaxial lead 31 to the mixer grid 28 of tube V–3 for heterodyning the received signals. Control grid 36 and plate 30 of V–4 are capacitively coupled by means of the motor-driven trimming condenser 37 (butterfly type) for providing feedback coupling. The difference-frequency between the oscillator 18 and amplified signal frequencies entering the mixer or converter 17 is coupled from the mixer anode or plate 38 to the first I. F. transformer or other load circuit (not shown) by means of a coaxial conductor 39.

In Figs. 2 to 5 inclusive, there is shown one practical embodiment of a preamplifier-receiver system built along the lines of the Fig. 1 diagrammatic circuit for the purpose of more clearly showing the manner in which the cavity resonator devices of the preamplifier system are mounted to obtain an extremely compact and fully shielded assembly. The preamplifier arrangement there shown comprises four tunable stages consisting of two stages of radio-frequency amplification followed by a converter stage, and a local oscillator stage. The variable capacitors employed in each of the four stages are ganged together and tuned by a single control dial by means of suitable gearing, as will be hereinafter described. The useful frequency range is from 380 mc. to 435 mc. Generally speaking, the four tuned circuits are of similar construction in that each consists of a metallic concentrically arranged hollow resonator cavity assembly disposed within an outer metallic box-like receptacle. Tracking is made possible by means of trimmer condensers which are preferably of the same type and capacity as the special main variable cylindrical tuning condensers, as will be hereinafter be described.

As illustrated in Figs. 2 to 5 inclusive, the arrangement there shown comprises a rigid chassis or container, generally designated by the reference numeral 40, formed of conductive material, such as aluminum or copper sheet material, which is fabricated into a hollow generally rectangular box-like receptacle. Vertical transverse metallic partition members 41, 42, 43 and 44 divide the interior of the receptacle 40 into four compartments or chambers 45, 46, 47 and 48 (see Fig. 3). As illustrated, each of these compartments is of substantially square cross-section and as in the order heretofore indicated form the 1st R-F amplifier stage 15, the 2nd R-F amplifier stage 16, the mixer or converter stage 17, and the oscillator stage 18, respectively, of the diagrammatic circuit represented in Fig. 1, the outer walls of the compartments being formed by the enclosing metallic side, top and bottom walls of the preamplifier receptacle 40.

Figure 4:
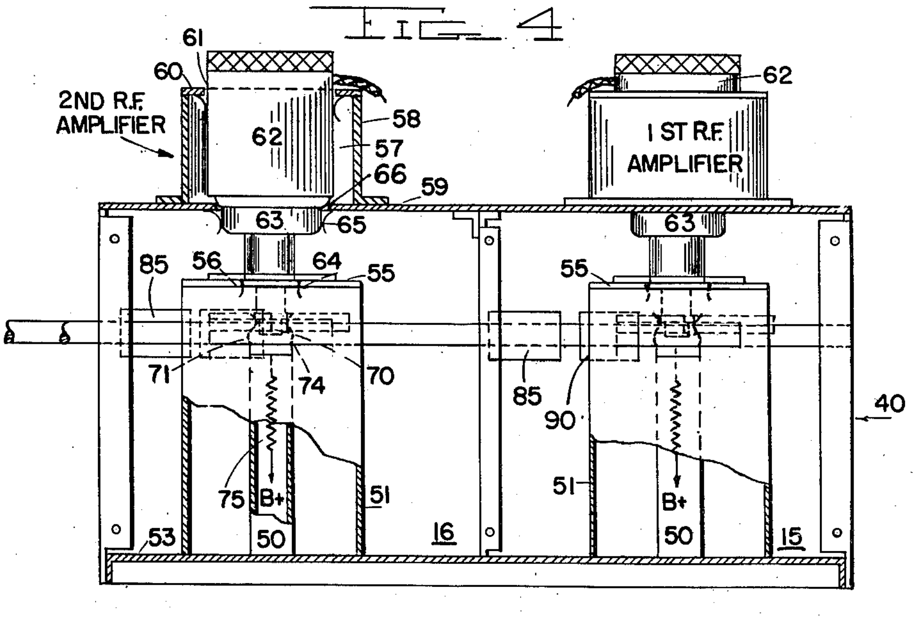
Fig. 4 is a side elevational view of the Fig. 1 preamplifier showing the first and second R-F amplifier stages thereof.

Positioned within the interior of each of the aforesaid compartments of the preamplifier is an assembly of concentrically arranged hollow conductors which in conjunction with the enclosing walls defining the chamber with which they are associated form the individual plate, cathode and grid cavity resonator tank circuits for the particular stage of the preamplifier. Thus, as illustrated in Fig. 4, the inner resonator assembly of each of the R-F amplifier stages 15 and 16, and the converter stage 17, comprises, in spaced relation, a central hollow cylindrical anode post 50, and an outer imperforate metallic box-like partition 51 of generally square cross-section. Partition 51 is formed of metal sheet stock, bent into the cross-sectional form above described, and suitably affixed at its lower ends, as by welding or soldering, to the bottom wall 53 of the receptacle 40. The top of the compartments 45 and 46 is closed by a cover plate 59 except for an aperture 66 coaxial with the hollow conductors 50 and 51. Positioned over the upper end of the outer partition 51 is a metallic cover plate 55 having a large central circular aperture 56 coaxially arranged with respect to the bore 57 of a sleeve-like member 58 upstanding from the cover plate 59. An annular cover plate 60 with a center circular aperture 61 partially closes the upper end of the sleeve 58, the aperture 61 being of a size to receive and removably accommodate an insertible closure plug 62 in the bottom of which there is provided a socket in which is demountably held a "lighthouse" tube 63 (GL–446) as shown in left half of the Fig. 4 representation. Annular ring type connectors 64 and 65 provided with resilient metal spring fingers encircling the apertures 56 and 66 connect the cathode and grid ring terminals of the "lighthouse" tube 63 to the cover plate 59 and the grid partition 51, respectively.

The tube 63 is axially insertible through the bore of the sleeve 58 from the top end of the chamber 16 by and at the time of insertion of the closure plug 62, the tube being suspended in an inverted position from the tube socket carried by the plug 62 with the anode cap 70 of the tube being engaged and resiliently held by the upwardly directed spring fingers of the anode connector 71 which is affixed to the upper end of the tubular anode post 50 and suitably electrically insulated therefrom. With the tube 63 thus positioned, the usual cathode band or shell of the tube engages the electrical ring-type connector 65 and the usual grid terminal disc engages the electrical ring-type connector 64. Electrical ring type connectors 64 and 65 are each of similar construction in that each has a central opening circumferentially bounded by a plurality of angularly disposed conductive resilient contact fingers arched radially inwardly with respect to the axis of the collar and integrally connected at their lower ends to an annular conductive skirt or flanged base member. A mica capacitor 74 (.005 mmfd.) separates the anode cap 70 from the anode post 50 and the operating plate potentials is supplied through the fingered anode connector 71 from an external source of high voltage (not shown) through the plate decoupling resistor 75 (5000 ohms).

Figure 3:
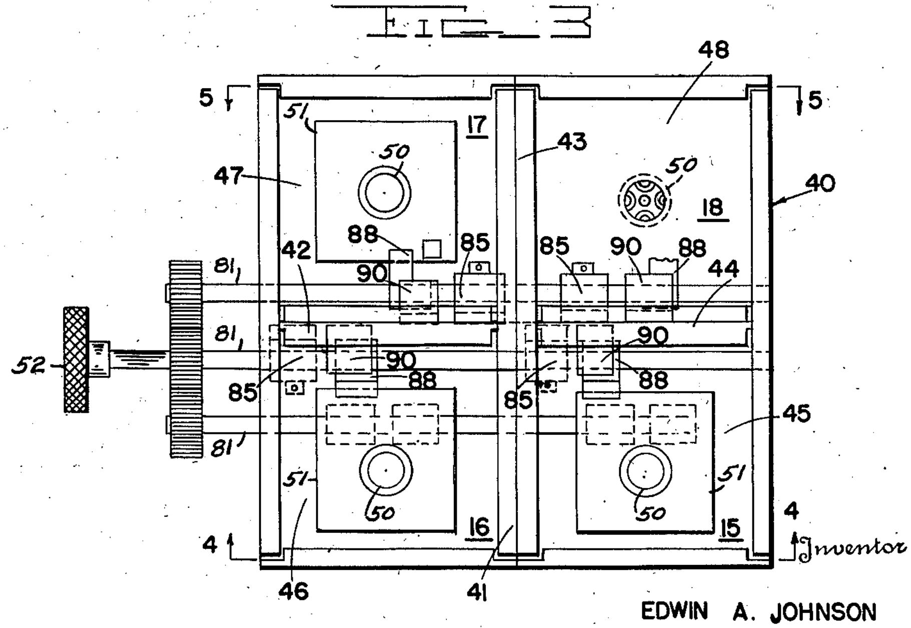
Figure 5:
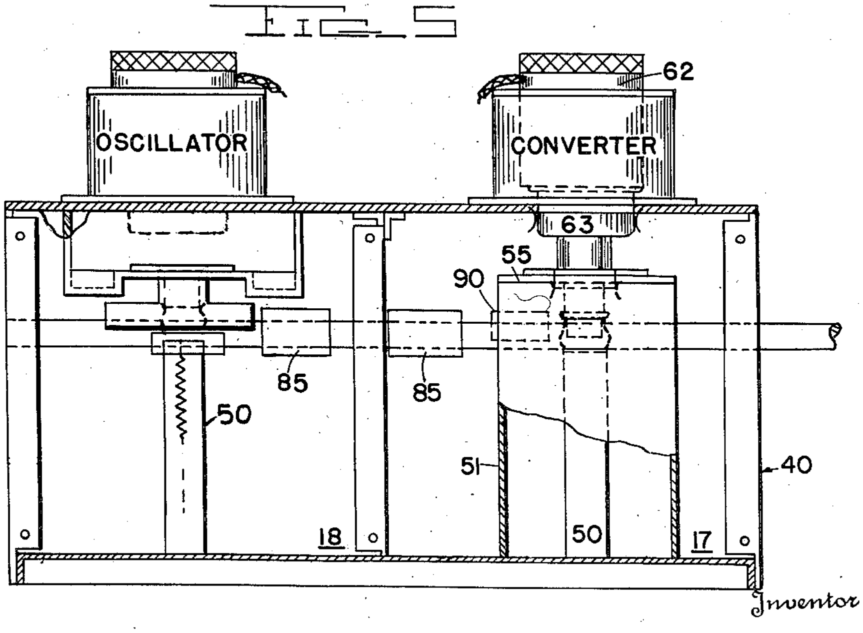
Fig. 5 is a side elevational view of the Fig. 1 preamplifier showing the oscillator and the converter stages thereof.

The physical arrangement and construction of the hollow conductor assembly forming the cavity resonator circuit of the converter stage 17 as shown in Figs. 3 and 5 is similar to that of both R-F amplifier stages just described, while that of the oscillator stage 18 shown in Fig. 5 has the apertured outer conductor structure disclosed and claimed in the copending patent application of Edwin A. Johnson, Serial No. 596,932, filed May 31, 1945, (U. S. Patent 2,520,148; granted August 29, 1950) for Ultra High Frequency Apparatus. As the physical relationship of the resonator parts of the oscillator unit 18 shown within the compartment 58 does not concern the present invention it is thought that further description thereof in greater detail to be unnecessary other than to state that the outer conductor has cut away portions or windows for effecting feedback coupling between the plate and grid tank resonant circuits, and that the outer conductor is suspended from the cover plate 59, thereby enveloping the grid-cathode section rather than the grid-anode section of the tube.

Figure 7:
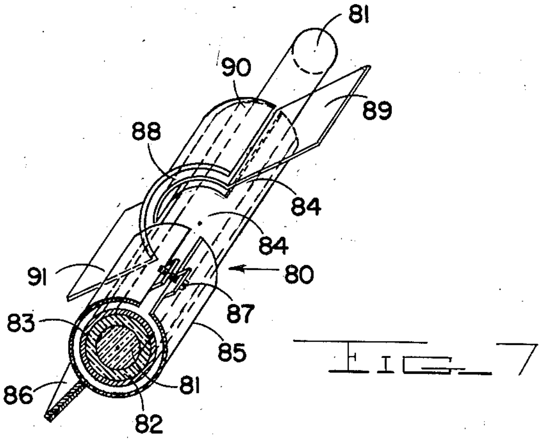
Fig. 7 is a perspective view of the special rotary variable capacitor structure used in conjunction with each of the resonators of the Fig. 1 preamplifier.

For tuning the respective inductances of the R-F amplifier circuits 15 and 16, the mixer or converter circuit 17 and the oscillator circuit 18 a novel form of rotatable variable cylindrical capacitor device 80 is used in conjunction with each of the cavity resonators, the construction and arrangement of each of these capacitors comprises one feature of the present invention, the specific description of one sufficing for the others. In Fig. 7 there is shown one of the capacitor units generally designated 80 which is of the cylindrical rotary type comprising a rotor shaft 81 of electrical insulating material, such as a Bakelite rod, having tightly fitted thereon an elongated cylindrical sleeve 82 of polystyrene upon which is tightly fitted, as by a press fit, a metallic sleeve 83 which forms the rotor electrode of the capacitor. The rotor element 83 is in part cylindrical and in part semi-cylindrical, and is coextensive with the dielectric sleeve 82. The sleeve 82 preferably has a ratio of length to diameter of at least 3:1 and is formed of a molded electrical insulating material, preferably a polystyrene resin, to such dimensions as to have a press-fit with respect to the rotor shaft 81.

Surrounding the cylindrical part 84 of the metal rotor sleeve 83 is a stator electrode in the form of split cylinder or collar 85, of sheet beryllium copper, having at diametrically disposed positions a metal tab connector 86. The cylinder 85 is spread or contracted by turning of the adjusting screw 87. Disposed in interleaved relation over the semi-cylindrical or cut-out part 84' of the metal sleeve 83 are the semi-cylindrical capacitor or electrode elements 88 and 90, respectively, each of sheet beryllium copper, the electrode 88 forming with the electrode 90 a shunt padding condenser while the leave 88 and the semi-cylindrical part 84' of the sleeve 83 form a trimmer condenser. Tabs 89 and 91 of the stator electrodes 88 and 90 respectively permit connection of the electrodes 88 and 90 to the respective cavity resonator tank circuit as shown in Fig. 3. The foregoing variable capacitor construction forms the patentable subject matter of and is described and claimed in the copending application of Irving H. Page, Serial No. 617,409, filed September 19, 1945, for Variable Capacitor.

Figure 6:
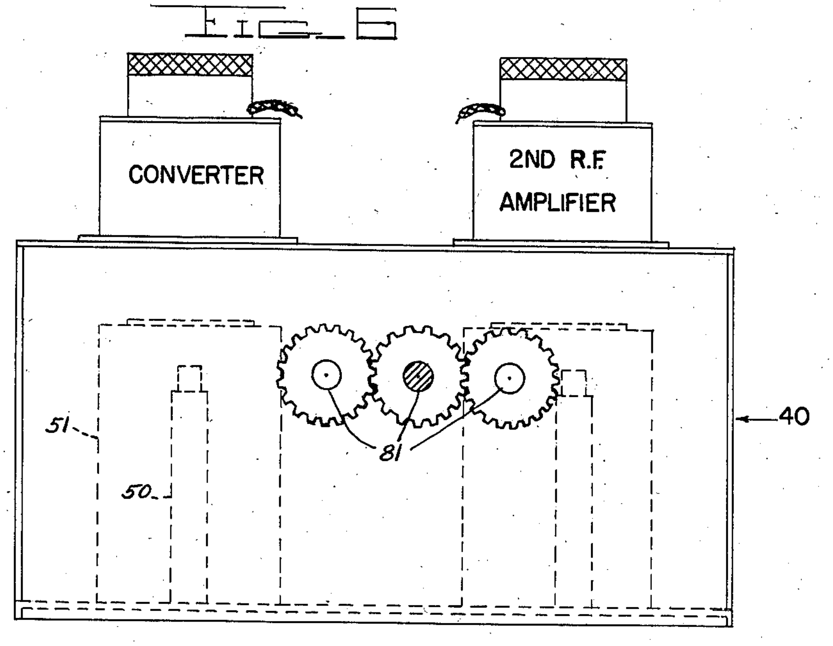
Fig. 6 is a front view of the Fig. 1 preamplifier showing the gearing arrangement of the gang-tuning system.
Figure 8:
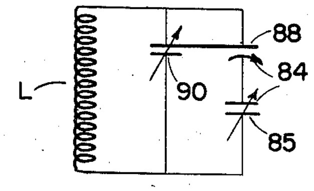
Fig. 8 is a schematic circuit diagram equivalent to operation of a portion of the system of Fig. 1 in which the Fig. 7 variable tuning capacitor is employed.

From Figures 3, 6 and 7, it is evident that turning knob 52 will transmit motion to the shaft 81 which will simultaneously vary the tuning capacitances associated with the R-F amplifier mixer and oscillator stages.

In accordance with the preamplifier arrangement above-described it will be apparent that each of said cavity resonator units forms a separate shielded compartment and that each also occupies one quadrant of an enclosing chamber having a generally square cross-section with the adjacent resonator devices being separated by common partitioning means. Furthermore, the foregoing arrangement provides a plurality of receiving stages disposed in cooperating operative relationship and forming in succession first and second radio-frequency amplifier circuits, a converter circuit, and an oscillator circuit wherein each stage incorporates a resonant chamber or cavity device as the inductance element and individually includes a vacuum tube operatively installed and connected therein together with rotary cylindrical type variable capacitor tuning means for tuning the associated cavity resonator devices. Provision is made for gang-controlled means for tuning the various cylindrical capacitors in unison.

While there has been described a preferred embodiment of the invention, it will be obvious to those skilled in the art that various changes and modifications may be made therein without departing from the spirit of the invention, and it is, therefore, to be distinctly understood that no limitations are intended other than are imposed by the scope of the appended claims as limited by the prior art.

The invention described herein may be manufactured and used by or for the Government of the United States of America for governmental purposes without the payment of any royalties thereon or therefor.

What is claimed is:

1. In a high frequency radio system wherein a plurality of stages are disposed in operative relation, said stages each including at least one resonant tank circuit, an integral unit comprising a plurality of wall members connected to form a plurality of adjacently positioned, substantially enclosed cavity resonator chambers having generally square cross sections, said adjacent chambers sharing a common wall member element, partition means within each of said chambers forming with said wall members a plurality of compartments therein which are positioned about respective common axes, the outermost compartments being dimensioned for use as a tank circuit element in the operating frequency range of said radio system, a plurality of electron discharge devices, each of said electron discharge devices positioned within one of said chambers concentrically of the said common axis thereof, the said wall members of each chamber together with the partitions and the electron discharge device therein being connected to form a complete stage of said radio system, and electric coupling means connecting between stages to form a more complete radio system.

2. A compact unitary assembly for a group of high frequency radio stages comprising, in combination, an external metallic shell substantially enclosing an assembly space, at least one internal, imperforate, metallic partition dividing said assembly space into adjacent isolated compartments, each compartment comprising a stage and each compartment having an aperture in an outer wall thereof, a pair of hollow conductors of disparate cross section supported in each compartment and spaced inclusive of and parallel to a line extending inwards from the center of said aperture and normal to the plane thereof, the larger cross section conductor by a dichotomy of the compartment space forming first and second resonant cavities conjointly with the compartment walls and the smaller cross section conductor respectively, an axially spaced, annular terminal type of triode aligned coaxial with each aperture and penetrating each compartment through said aperture, separate means within each compartment for coupling the cathode, grid and anode terminals of said triode to the aperture periphery, larger cross section conductor distal end and smaller cross section conductor distal end respectively, and separate means within each chamber communicative of input signals, output signals and operating energy between said triode and the exterior of the compartment.

3. A compact unitary assembly for a group of high frequency radio stages comprising, in combination, an external metallic shell, including top and bottom sections normal to a reference line, at least one internal imperforate metallic partition disposed parallel to said reference line and dividing said assembly space into adjacent isolated compartments of generally square cross section, each compartment comprising a stage and each compartment having an aperture centered in the top wall thereof, a pair of hollow conductors of disparate cross section supported in each compartment and spaced symmetrically about and parallel to a compartment axis extending inwards from the center of the aperture and normal to the plane thereof, the larger cross section conductor by a dichotomy of the compartment space forming first and second resonant cavities conjointly with the compartment walls and the smaller cross section conductor respectively, an axially spaced, annular terminal type of triode coaxial with each aperture and penetrating each compartment through said aperture, the cathode, grid and anode terminals of said triode registering respectively with the aperture periphery, outer conductor distal end and inner conductor distal end, separate means in each compartment coupling said terminals to their corresponding registering elements, and separate means in each compartment communicative of input signals, output signals and operating energy between said triode and the exterior of the chamber.

EDWIN A. JOHNSON.

REFERENCES CITED

The following references are of record in the file of this patent:

UNITED STATES PATENTS

| Number | Name | Date |
|---|---|---|
| 2,066,674 | Dunmore | Jan. 5, 1937 |
| 2,169,305 | Tunick | Aug. 15, 1939 |
| 2,190,712 | Hansen | Feb. 20, 1940 |
| 2,272,062 | George | Feb. 3, 1942 |
| 2,272,066 | Peterson | Feb. 3, 1942 |
| 2,303,388 | Pray | Dec. 1, 1942 |